(12) United States Patent
Strid et al.

(10) Patent No.: US 7,723,999 B2
(45) Date of Patent: May 25, 2010

(54) CALIBRATION STRUCTURES FOR DIFFERENTIAL SIGNAL PROBING

(75) Inventors: Eric Strid, Portland, OR (US); Richard Campbell, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/710,150

(22) Filed: Feb. 22, 2007

(65) Prior Publication Data

US 2007/0285107 A1 Dec. 13, 2007

Related U.S. Application Data

(60) Provisional application No. 60/813,121, filed on Jun. 12, 2006.

(51) Int. Cl.
*G01R 35/00* (2006.01)
*G01R 31/02* (2006.01)
*G01R 31/28* (2006.01)

(52) U.S. Cl. ............... 324/601; 324/754; 324/158.1

(58) Field of Classification Search ............ 324/754, 324/765, 158.1; 702/90, 91, 104, 106, 107
See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 2,947,939 A | 8/1960 | Harwig |
| 3,111,699 A | 11/1963 | Comeau |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |

(Continued)

FOREIGN PATENT DOCUMENTS

CH 607 045 11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Ha Tran T Nguyen
*Assistant Examiner*—Karen M Kusumakar
(74) *Attorney, Agent, or Firm*—Chernoff, Vilhauer, McClung & Stenzel

(57) ABSTRACT

A plurality of calibration structures facilitate calibration of a probing system that includes a differential signal probe having a linear array of probe tips.

2 Claims, 7 Drawing Sheets

U.S. PATENT DOCUMENTS

| | | | |
|---|---|---|---|
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tschirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |

| | | | | | |
|---|---|---|---|---|---|
| 4,734,641 A | 3/1988 | Byrd, Jr. et al. | 5,003,253 A | 3/1991 | Majidi-Ahy et al. |
| 4,739,259 A | 4/1988 | Hadwin et al. | 5,007,163 A | 4/1991 | Pope et al. |
| 4,740,764 A | 4/1988 | Gerlack | 5,012,186 A | 4/1991 | Gleason |
| 4,742,571 A | 5/1988 | Letron | 5,020,219 A | 6/1991 | Leedy |
| 4,744,041 A | 5/1988 | Strunk et al. | 5,021,186 A | 6/1991 | Ota et al. |
| 4,746,857 A | 5/1988 | Sakai et al. | 5,030,907 A | 7/1991 | Yih et al. |
| 4,749,942 A | 6/1988 | Sang et al. | 5,041,782 A | 8/1991 | Marzan |
| 4,754,239 A | 6/1988 | Sedivec | 5,045,781 A | 9/1991 | Gleason et al. |
| 4,755,746 A | 7/1988 | Mallory et al. | 5,059,898 A | 10/1991 | Barsotti et al. |
| 4,755,747 A | 7/1988 | Sato | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,066,357 A | 11/1991 | Smyth, Jr. et al. |
| 4,764,723 A | 8/1988 | Strid | 5,069,628 A | 12/1991 | Crumly |
| 4,766,384 A | 8/1988 | Kleinberg et al. | 5,082,627 A | 1/1992 | Stanbro |
| 4,772,846 A | 9/1988 | Reeds | 5,084,671 A | 1/1992 | Miyata et al. |
| 4,780,670 A | 10/1988 | Cherry | 5,089,774 A | 2/1992 | Nakano |
| 4,783,625 A | 11/1988 | Harry et al. | 5,091,692 A | 2/1992 | Ohno et al. |
| 4,788,851 A | 12/1988 | Brault | 5,091,732 A | 2/1992 | Mileski et al. |
| 4,791,363 A | 12/1988 | Logan | 5,095,891 A | 3/1992 | Reitter |
| 4,793,814 A | 12/1988 | Zifcak et al. | 5,097,101 A | 3/1992 | Trobough |
| 4,795,962 A | 1/1989 | Yanagawa et al. | 5,097,207 A | 3/1992 | Blanz |
| 4,805,627 A | 2/1989 | Klingenbeck et al. | 5,101,453 A | 3/1992 | Rumbaugh |
| 4,810,981 A | 3/1989 | Herstein | 5,107,076 A | 4/1992 | Bullock et al. |
| 4,812,754 A | 3/1989 | Tracy et al. | 5,116,180 A | 5/1992 | Fung et al. |
| 4,818,059 A | 4/1989 | Kakii et al. | 5,126,286 A | 6/1992 | Chance |
| 4,827,211 A | 5/1989 | Strid et al. | 5,126,696 A | 6/1992 | Grote et al. |
| 4,831,494 A | 5/1989 | Arnold et al. | 5,128,612 A | 7/1992 | Aton et al. |
| 4,835,495 A | 5/1989 | Simonutti | 5,129,006 A | 7/1992 | Hill |
| 4,837,507 A | 6/1989 | Hechtman | 5,133,119 A | 7/1992 | Afshari et al. |
| 4,839,587 A | 6/1989 | Flatley et al. | 5,134,365 A | 7/1992 | Okubo et al. |
| 4,849,689 A | 7/1989 | Gleason et al. | 5,136,237 A | 8/1992 | Smith et al. |
| 4,851,767 A | 7/1989 | Halbout et al. | 5,138,289 A | 8/1992 | McGrath |
| 4,853,624 A | 8/1989 | Rabjohn | 5,142,224 A | 8/1992 | Smith et al. |
| 4,853,627 A | 8/1989 | Gleason et al. | 5,145,552 A | 9/1992 | Yoshizawa et al. |
| 4,858,160 A | 8/1989 | Strid et al. | 5,148,131 A | 9/1992 | Amboss et al. |
| 4,859,989 A | 8/1989 | McPherson | 5,159,264 A | 10/1992 | Anderson |
| 4,864,227 A | 9/1989 | Sato | 5,159,267 A | 10/1992 | Anderson |
| 4,871,883 A | 10/1989 | Guiol | 5,159,752 A | 11/1992 | Mahant-Shetti et al. |
| 4,871,964 A | 10/1989 | Boll et al. | 5,160,883 A | 11/1992 | Blanz |
| 4,888,550 A | 12/1989 | Reid | 5,164,319 A | 11/1992 | Hafeman et al. |
| 4,891,584 A | 1/1990 | Kamieniecki et al. | 5,166,606 A | 11/1992 | Blanz |
| 4,893,914 A | 1/1990 | Hancock et al. | 5,170,930 A | 12/1992 | Dolbear et al. |
| 4,894,612 A | 1/1990 | Drake et al. | 5,172,049 A | 12/1992 | Kiyokawa et al. |
| 4,899,126 A | 2/1990 | Yamada | 5,172,050 A | 12/1992 | Swapp |
| 4,899,998 A | 2/1990 | Feramachi | 5,172,051 A | 12/1992 | Zamborelli |
| 4,901,012 A | 2/1990 | Gloanec et al. | 5,177,438 A | 1/1993 | Littlebury et al. |
| 4,904,933 A | 2/1990 | Snyder et al. | 5,180,977 A | 1/1993 | Huff |
| 4,904,935 A | 2/1990 | Calma et al. | 5,187,443 A | 2/1993 | Bereskin |
| 4,906,920 A | 3/1990 | Huff et al. | 5,198,752 A | 3/1993 | Miyata et al. |
| 4,908,570 A | 3/1990 | Gupta et al. | 5,198,753 A | 3/1993 | Hamburgen |
| 4,912,399 A | 3/1990 | Greub et al. | 5,202,558 A | 4/1993 | Barker |
| 4,916,002 A | 4/1990 | Carver | 5,202,648 A | 4/1993 | McCandless |
| 4,916,398 A | 4/1990 | Rath | 5,207,585 A | 5/1993 | Byrnes et al. |
| 4,918,373 A | 4/1990 | Newberg | 5,214,243 A | 5/1993 | Johnson |
| 4,918,383 A | 4/1990 | Huff et al. | 5,214,374 A | 5/1993 | St. Onge |
| 4,922,128 A | 5/1990 | Dhong et al. | 5,225,037 A | 7/1993 | Elder et al. |
| 4,922,186 A | 5/1990 | Tsuchiya et al. | 5,227,730 A | 7/1993 | King et al. |
| 4,922,912 A | 5/1990 | Watanabe | 5,232,789 A | 8/1993 | Platz et al. |
| 4,926,172 A | 5/1990 | Gorsek | 5,233,197 A | 8/1993 | Bowman et al. |
| 4,929,893 A | 5/1990 | Sato et al. | 5,233,306 A | 8/1993 | Misra |
| 4,965,514 A | 10/1990 | Herrick | 5,245,292 A | 9/1993 | Milesky et al. |
| 4,970,386 A | 11/1990 | Buck | 5,266,889 A | 11/1993 | Harwood et al. |
| 4,972,073 A | 11/1990 | Lessing | 5,266,963 A | 11/1993 | Carter |
| 4,975,638 A | 12/1990 | Evans et al. | 5,267,088 A | 11/1993 | Nomura |
| 4,980,637 A | 12/1990 | Huff et al. | 5,270,664 A | 12/1993 | McMurty et al. |
| 4,980,638 A | 12/1990 | Dermon et al. | 5,274,336 A | 12/1993 | Crook et al. |
| 4,983,910 A | 1/1991 | Majidi-Ahy et al. | 5,280,156 A | 1/1994 | Niori et al. |
| 4,987,100 A | 1/1991 | McBride et al. | 5,281,364 A | 1/1994 | Stirling et al. |
| 4,988,062 A | 1/1991 | London | 5,289,117 A | 2/1994 | Van Loan et al. |
| 4,991,290 A | 2/1991 | MacKay | 5,293,175 A | 3/1994 | Hemmie et al. |
| 4,998,062 A | 3/1991 | Ikeda | 5,298,972 A | 3/1994 | Heffner |
| 4,998,063 A | 3/1991 | Miller | 5,304,924 A | 4/1994 | Yamano et al. |
| 5,001,423 A | 3/1991 | Abrami | 5,308,250 A | 5/1994 | Walz |

| | | | | | |
|---|---|---|---|---|---|
| 5,313,157 A | 5/1994 | Pasiecznik, Jr. | 5,561,378 A | 10/1996 | Bockelman et al. |
| 5,315,237 A | 5/1994 | Iwakura et al. | 5,565,788 A | 10/1996 | Burr et al. |
| 5,316,435 A | 5/1994 | Mozingo | 5,565,881 A | 10/1996 | Phillips et al. |
| 5,317,656 A | 5/1994 | Moslehi et al. | 5,569,591 A | 10/1996 | Kell et al. |
| 5,321,352 A | 6/1994 | Takebuchi | 5,571,324 A | 11/1996 | Sago et al. |
| 5,321,453 A | 6/1994 | Mori et al. | 5,578,932 A | 11/1996 | Adamian |
| 5,326,412 A | 7/1994 | Schreiber et al. | 5,583,445 A | 12/1996 | Mullen |
| 5,334,931 A | 8/1994 | Clarke et al. | 5,584,120 A | 12/1996 | Roberts |
| 5,347,204 A | 9/1994 | Gregory et al. | 5,584,608 A | 12/1996 | Gillespie |
| 5,355,079 A | 10/1994 | Evans et al. | 5,589,781 A | 12/1996 | Higgens et al. |
| 5,357,211 A | 10/1994 | Bryson et al. | 5,594,358 A | 1/1997 | Ishikawa et al. |
| 5,360,312 A | 11/1994 | Mozingo | 5,600,256 A | 2/1997 | Woith et al. |
| 5,361,049 A | 11/1994 | Rubin et al. | 5,601,740 A | 2/1997 | Eldridge et al. |
| 5,363,050 A | 11/1994 | Guo et al. | 5,610,529 A | 3/1997 | Schwindt |
| 5,367,165 A | 11/1994 | Toda et al. | 5,611,008 A | 3/1997 | Yap |
| 5,369,368 A | 11/1994 | Kassen et al. | 5,617,035 A | 4/1997 | Swapp |
| 5,371,654 A | 12/1994 | Beaman et al. | 5,621,333 A | 4/1997 | Long et al. |
| 5,373,231 A | 12/1994 | Boll et al. | 5,621,400 A | 4/1997 | Corbi |
| 5,374,938 A | 12/1994 | Hatazawa et al. | 5,623,213 A | 4/1997 | Liu et al. |
| 5,376,790 A | 12/1994 | Linker et al. | 5,623,214 A | 4/1997 | Pasiecznik, Jr. |
| 5,383,787 A | 1/1995 | Switky et al. | 5,627,473 A | 5/1997 | Takami |
| 5,389,885 A | 2/1995 | Swart | 5,628,057 A | 5/1997 | Phillips et al. |
| 5,395,253 A | 3/1995 | Crumly | 5,629,838 A | 5/1997 | Knight et al. |
| 5,397,855 A | 3/1995 | Ferlier | 5,631,571 A | 5/1997 | Spaziani et al. |
| 5,404,111 A | 4/1995 | Mori et al. | 5,633,780 A | 5/1997 | Cronin |
| 5,408,188 A | 4/1995 | Katoh | 5,635,846 A | 6/1997 | Beaman et al. |
| 5,408,189 A | 4/1995 | Swart et al. | 5,642,298 A | 6/1997 | Mallory et al. |
| 5,412,330 A | 5/1995 | Ravel et al. | 5,644,248 A | 7/1997 | Fujimoto |
| 5,412,866 A | 5/1995 | Woith et al. | 5,653,939 A | 8/1997 | Hollis et al. |
| 5,414,565 A | 5/1995 | Sullivan et al. | 5,656,942 A | 8/1997 | Watts et al. |
| 5,422,574 A | 6/1995 | Kister | 5,659,421 A | 8/1997 | Rahmel et al. |
| 5,430,813 A | 7/1995 | Anderson et al. | 5,666,063 A | 9/1997 | Abercrombie et al. |
| 5,441,690 A | 8/1995 | Ayala-Esquilin et al. | 5,669,316 A | 9/1997 | Faz et al. |
| 5,451,884 A | 9/1995 | Sauerland | 5,670,322 A | 9/1997 | Eggers et al. |
| 5,453,404 A | 9/1995 | Leedy | 5,670,888 A | 9/1997 | Cheng |
| 5,457,398 A | 10/1995 | Schwindt et al. | 5,672,816 A | 9/1997 | Park et al. |
| 5,463,324 A | 10/1995 | Wardwell et al. | 5,675,499 A | 10/1997 | Lee et al. |
| 5,467,024 A | 11/1995 | Swapp | 5,675,932 A | 10/1997 | Mauney |
| 5,469,324 A | 11/1995 | Henderson et al. | 5,676,360 A | 10/1997 | Boucher et al. |
| 5,471,185 A | 11/1995 | Shea et al. | 5,678,210 A | 10/1997 | Hannah |
| 5,475,316 A | 12/1995 | Hurley et al. | 5,685,232 A | 11/1997 | Inoue |
| 5,476,211 A | 12/1995 | Khandros | 5,686,317 A | 11/1997 | Akram et al. |
| 5,477,011 A | 12/1995 | Singles et al. | 5,686,960 A | 11/1997 | Sussman et al. |
| 5,478,748 A | 12/1995 | Akins, Jr. et al. | 5,688,618 A | 11/1997 | Hulderman et al. |
| 5,479,108 A | 12/1995 | Cheng | 5,700,844 A | 12/1997 | Hederick et al. |
| 5,479,109 A | 12/1995 | Lau et al. | 5,704,355 A | 1/1998 | Bridges |
| 5,481,196 A | 1/1996 | Nosov | 5,715,819 A | 2/1998 | Svenson et al. |
| 5,481,936 A | 1/1996 | Yanagisawa | 5,720,098 A | 2/1998 | Kister |
| 5,487,999 A | 1/1996 | Farnworth | 5,723,347 A | 3/1998 | Kirano et al. |
| 5,488,954 A | 2/1996 | Sleva et al. | 5,726,211 A | 3/1998 | Hedrick et al. |
| 5,491,425 A | 2/1996 | Watanabe et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Bedrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A * | 8/1998 | Bockelman et al. ......... 324/601 |
| 5,532,608 A | 7/1996 | Behfar-Rad et al. | 5,794,133 A | 8/1998 | Kashima |
| 5,537,372 A | 7/1996 | Albrecht et al. | 5,803,607 A | 9/1998 | Jones et al. |
| 5,539,323 A | 7/1996 | Davis, Jr. | 5,804,607 A | 9/1998 | Hedrick et al. |
| 5,539,676 A | 7/1996 | Yamaguchi | 5,804,982 A | 9/1998 | Lo et al. |
| 5,550,481 A | 8/1996 | Holmes et al. | 5,804,983 A | 9/1998 | Nakajima et al. |

| | | | | | | |
|---|---|---|---|---|---|---|
| 5,806,181 A | 9/1998 | Khandros et al. | | 5,998,864 A | 12/1999 | Khandros et al. |
| 5,807,107 A | 9/1998 | Bright et al. | | 5,999,268 A | 12/1999 | Yonezawa et al. |
| 5,808,874 A | 9/1998 | Smith | | 6,001,760 A | 12/1999 | Katsuda et al. |
| 5,810,607 A | 9/1998 | Shih et al. | | 6,002,426 A | 12/1999 | Back et al. |
| 5,811,751 A | 9/1998 | Leona et al. | | 6,006,002 A | 12/1999 | Motok et al. |
| 5,811,982 A | 9/1998 | Beaman et al. | | 6,013,586 A | 1/2000 | McGhee et al. |
| 5,813,847 A | 9/1998 | Eroglu et al. | | 6,019,612 A | 2/2000 | Hasegawa et al. |
| 5,814,847 A | 9/1998 | Shihadeh et al. | | 6,023,103 A | 2/2000 | Chang et al. |
| 5,820,014 A | 10/1998 | Dozier, II et al. | | 6,028,435 A | 2/2000 | Nikawa |
| 5,821,763 A | 10/1998 | Beaman et al. | | 6,029,344 A | 2/2000 | Khandros et al. |
| 5,824,494 A | 10/1998 | Feldberg | | 6,031,383 A | 2/2000 | Streib et al. |
| 5,829,128 A | 11/1998 | Eldridge et al. | | 6,032,356 A | 3/2000 | Eldridge et al. |
| 5,829,437 A | 11/1998 | Bridges | | 6,032,714 A | 3/2000 | Fenton |
| 5,831,442 A | 11/1998 | Heigl | | 6,033,935 A | 3/2000 | Dozier, II et al. |
| 5,832,601 A | 11/1998 | Eldridge et al. | | 6,034,533 A | 3/2000 | Tervo et al. |
| 5,833,601 A | 11/1998 | Swartz et al. | | 6,037,785 A | 3/2000 | Higgins |
| 5,838,160 A | 11/1998 | Beaman et al. | | 6,040,739 A | 3/2000 | Wedeen et al. |
| 5,841,288 A | 11/1998 | Meaney et al. | | 6,042,712 A | 3/2000 | Mathieu |
| 5,841,342 A | 11/1998 | Hegmann et al. | | 6,043,563 A | 3/2000 | Eldridge et al. |
| 5,846,708 A | 12/1998 | Hollis et al. | | 6,046,599 A | 4/2000 | Long et al. |
| 5,847,569 A | 12/1998 | Ho et al. | | 6,049,216 A | 4/2000 | Yang et al. |
| 5,848,500 A | 12/1998 | Kirk | | 6,049,976 A | 4/2000 | Khandros |
| 5,852,232 A | 12/1998 | Samsavar et al. | | 6,050,829 A | 4/2000 | Eldridge et al. |
| 5,852,871 A | 12/1998 | Khandros | | 6,051,422 A | 4/2000 | Kovacs et al. |
| 5,854,608 A | 12/1998 | Leisten | | 6,052,653 A | 4/2000 | Mazur et al. |
| 5,864,946 A | 2/1999 | Eldridge et al. | | 6,054,651 A | 4/2000 | Fogel et al. |
| 5,867,073 A | 2/1999 | Weinreb et al. | | 6,054,869 A | 4/2000 | Hutton et al. |
| 5,869,326 A | 2/1999 | Hofmann | | 6,059,982 A | 5/2000 | Palagonia et al. |
| 5,869,974 A | 2/1999 | Akram et al. | | 6,060,888 A | 5/2000 | Blackham et al. |
| 5,874,361 A | 2/1999 | Collins et al. | | 6,060,892 A | 5/2000 | Yamagata |
| 5,876,082 A | 3/1999 | Kempf et al. | | 6,061,589 A | 5/2000 | Bridges et al. |
| 5,878,486 A | 3/1999 | Eldridge et al. | | 6,062,879 A | 5/2000 | Beaman et al. |
| 5,879,289 A | 3/1999 | Yarush et al. | | 6,064,213 A | 5/2000 | Khandros et al. |
| 5,883,522 A | 3/1999 | O'Boyle | | 6,064,217 A | 5/2000 | Smith |
| 5,883,523 A | 3/1999 | Ferland et al. | | 6,064,218 A | 5/2000 | Godfrey et al. |
| 5,884,398 A | 3/1999 | Eldridge et al. | | 6,066,911 A | 5/2000 | Lindemann et al. |
| 5,888,075 A | 3/1999 | Hasegawa et al. | | 6,071,009 A | 6/2000 | Clyne |
| 5,892,539 A | 4/1999 | Colvin | | 6,078,183 A | 6/2000 | Cole, Jr. |
| 5,896,038 A | 4/1999 | Budnaitis et al. | | 6,078,500 A | 6/2000 | Beaman et al. |
| 5,900,737 A | 5/1999 | Graham et al. | | 6,090,261 A | 7/2000 | Mathieu |
| 5,900,738 A | 5/1999 | Khandros et al. | | 6,091,236 A | 7/2000 | Piety et al. |
| 5,903,143 A | 5/1999 | Mochizuki et al. | | 6,091,255 A | 7/2000 | Godfrey |
| 5,905,421 A | 5/1999 | Oldfield | | 6,091,256 A | 7/2000 | Long et al. |
| 5,910,727 A | 6/1999 | Fujihara et al. | | 6,096,567 A | 8/2000 | Kaplan et al. |
| 5,912,046 A | 6/1999 | Eldridge et al. | | 6,100,708 A * | 8/2000 | Mizuta ..................... 324/762 |
| 5,914,613 A | 6/1999 | Gleason et al. | | 6,100,815 A | 8/2000 | Pailthorp |
| 5,914,614 A | 6/1999 | Beaman et al. | | 6,104,201 A | 8/2000 | Beaman et al. |
| 5,916,689 A | 6/1999 | Collins et al. | | 6,104,206 A | 8/2000 | Verkull |
| 5,917,707 A | 6/1999 | Khandros et al. | | 6,110,823 A | 8/2000 | Eldridge et al. |
| 5,923,180 A | 7/1999 | Botka et al. | | 6,114,864 A | 9/2000 | Soejima et al. |
| 5,926,029 A | 7/1999 | Ference et al. | | 6,114,865 A | 9/2000 | Lagowski et al. |
| 5,926,951 A | 7/1999 | Khandros et al. | | 6,118,287 A | 9/2000 | Boll et al. |
| 5,940,965 A | 8/1999 | Uhling et al. | | 6,118,894 A | 9/2000 | Schwartz et al. |
| 5,944,093 A | 8/1999 | Viswanath | | 6,121,836 A | 9/2000 | Vallencourt |
| 5,945,836 A | 8/1999 | Sayre et al. | | 6,124,725 A | 9/2000 | Sato |
| 5,949,383 A | 9/1999 | Hayes et al. | | 6,127,831 A | 10/2000 | Khoury et al. |
| 5,949,579 A | 9/1999 | Baker | | 6,130,536 A | 10/2000 | Powell et al. |
| 5,959,461 A | 9/1999 | Brown et al. | | 6,137,302 A | 10/2000 | Schwindt |
| 5,963,364 A | 10/1999 | Leong et al. | | 6,144,212 A | 11/2000 | Mizuta |
| 5,966,645 A | 10/1999 | Davis | | 6,146,908 A * | 11/2000 | Falque et al. .................. 438/11 |
| 5,970,429 A | 10/1999 | Martin | | 6,147,502 A | 11/2000 | Fryer et al. |
| 5,973,504 A | 10/1999 | Chong | | 6,147,851 A | 11/2000 | Anderson |
| 5,974,662 A | 11/1999 | Eldridge et al. | | 6,150,186 A | 11/2000 | Chen et al. |
| 5,977,783 A | 11/1999 | Takayama et al. | | 6,160,407 A | 12/2000 | Nikawa |
| 5,981,268 A | 11/1999 | Kovacs et al. | | 6,166,553 A | 12/2000 | Sinsheimer |
| 5,982,166 A | 11/1999 | Mautz | | 6,168,974 B1 | 1/2001 | Chang et al. |
| 5,983,493 A | 11/1999 | Eldridge et al. | | 6,169,410 B1 | 1/2001 | Grace et al. |
| 5,993,611 A | 11/1999 | Moroney, III et al. | | 6,172,337 B1 | 1/2001 | Johnsgard et al. |
| 5,994,152 A | 11/1999 | Khandros et al. | | 6,174,744 B1 | 1/2001 | Watanabe et al. |
| 5,995,914 A | 11/1999 | Cabot | | 6,175,228 B1 | 1/2001 | Zamborelli et al. |
| 5,996,102 A | 11/1999 | Haulin | | 6,181,144 B1 | 1/2001 | Hembree et al. |
| 5,998,228 A | 12/1999 | Eldridge et al. | | 6,181,149 B1 | 1/2001 | Godfrey et al. |
| 5,998,768 A | 12/1999 | Hunter et al. | | 6,181,297 B1 | 1/2001 | Leisten |

| | | |
|---|---|---|
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,201,453 B1 | 3/2001 | Chan et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,259,260 B1 | 7/2001 | Smith et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Muhlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 * | 11/2002 | Nayler et al. ............... 324/754 |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |

| | | | | | | |
|---|---|---|---|---|---|---|
| 6,605,955 B1 | 8/2003 | Costello et al. | | 6,777,319 B2 | 8/2004 | Grube et al. |
| 6,606,014 B2 | 8/2003 | Miller | | 6,778,140 B1 | 8/2004 | Yeh |
| 6,606,575 B2 | 8/2003 | Miller | | 6,778,406 B2 | 8/2004 | Grube et al. |
| 6,608,494 B1 | 8/2003 | Bruce et al. | | 6,780,001 B2 | 8/2004 | Eldridge et al. |
| 6,611,417 B2 | 8/2003 | Chen | | 6,784,674 B2 | 8/2004 | Miller |
| 6,615,485 B2 | 9/2003 | Eldridge et al. | | 6,784,677 B2 | 8/2004 | Miller |
| 6,616,966 B2 | 9/2003 | Mathieu et al. | | 6,784,679 B2 | 8/2004 | Sweet et al. |
| 6,617,862 B1 | 9/2003 | Bruce | | 6,788,093 B2 | 9/2004 | Aitren et al. |
| 6,617,866 B1 | 9/2003 | Ickes | | 6,788,094 B2 | 9/2004 | Khandros et al. |
| 6,621,082 B2 | 9/2003 | Morita et al. | | 6,791,176 B2 | 9/2004 | Mathieu et al. |
| 6,621,260 B2 | 9/2003 | Eldridge et al. | | 6,794,888 B2 | 9/2004 | Kawaguchi et al. |
| 6,622,103 B1 | 9/2003 | Miller | | 6,794,934 B2 | 9/2004 | Betti-Berutto et al. |
| 6,624,648 B2 | 9/2003 | Eldridge et al. | | 6,794,950 B2 | 9/2004 | Du Toit et al. |
| 6,627,461 B2 | 9/2003 | Chapman et al. | | 6,798,225 B2 | 9/2004 | Miller |
| 6,627,483 B2 | 9/2003 | Ondricek et al. | | 6,798,226 B2 | 9/2004 | Altmann et al. |
| 6,627,980 B2 | 9/2003 | Eldridge | | 6,806,724 B2 | 10/2004 | Hayden et al. |
| 6,628,503 B2 | 9/2003 | Sogard | | 6,806,836 B2 | 10/2004 | Ogawa et al. |
| 6,628,980 B2 | 9/2003 | Atalar et al. | | 6,807,734 B2 | 10/2004 | Eldridge et al. |
| 6,633,174 B1 | 10/2003 | Satya et al. | | 6,809,533 B1 | 10/2004 | Anlage et al. |
| 6,636,182 B2 | 10/2003 | Mehltretter | | 6,811,406 B2 | 11/2004 | Grube |
| 6,639,461 B1 | 10/2003 | Tam et al. | | 6,812,691 B2 | 11/2004 | Miller |
| 6,640,415 B2 | 11/2003 | Eslamy et al. | | 6,812,718 B1 | 11/2004 | Chong et al. |
| 6,640,432 B1 | 11/2003 | Mathieu et al. | | 6,815,963 B2 | 11/2004 | Gleason et al. |
| 6,642,625 B2 | 11/2003 | Dozier, II et al. | | 6,816,031 B1 | 11/2004 | Miller |
| 6,643,597 B1 | 11/2003 | Dunsmore | | 6,816,840 B1 | 11/2004 | Goodwin, III |
| 6,644,982 B1 | 11/2003 | Ondricek et al. | | 6,817,052 B2 | 11/2004 | Grube |
| 6,646,520 B2 | 11/2003 | Miller | | 6,818,840 B2 | 11/2004 | Khandros |
| 6,653,903 B2 | 11/2003 | Leich et al. | | 6,822,463 B1 | 11/2004 | Jacobs |
| 6,655,023 B1 | 12/2003 | Eldridge et al. | | 6,822,529 B2 | 11/2004 | Miller |
| 6,657,455 B2 | 12/2003 | Eldridge et al. | | 6,825,052 B2 | 11/2004 | Eldridge et al. |
| 6,657,601 B2 | 12/2003 | McLean | | 6,825,422 B2 | 11/2004 | Eldridge et al. |
| 6,661,316 B2 | 12/2003 | Hreish et al. | | 6,827,584 B2 | 12/2004 | Mathieu et al. |
| 6,664,628 B2 | 12/2003 | Khandros et al. | | 6,835,898 B2 | 12/2004 | Eldridge et al. |
| 6,669,489 B1 | 12/2003 | Dozier, II et al. | | 6,836,962 B2 | 1/2005 | Khandros et al. |
| 6,672,875 B1 | 1/2004 | Mathieu et al. | | 6,838,885 B2 | 1/2005 | Kamitani |
| 6,677,744 B1 | 1/2004 | Long | | 6,838,893 B2 | 1/2005 | Khandros et al. |
| 6,678,850 B2 | 1/2004 | Roy et al. | | 6,839,964 B2 | 1/2005 | Henson |
| 6,678,876 B2 | 1/2004 | Stevens et al. | | 6,845,491 B2 | 1/2005 | Miller et al. |
| 6,680,659 B2 | 1/2004 | Miller | | 6,850,082 B2 | 2/2005 | Schwindt |
| 6,685,817 B1 | 2/2004 | Mathieu | | 6,856,129 B2 | 2/2005 | Thomas et al. |
| 6,686,754 B2 | 2/2004 | Miller | | 6,856,150 B2 | 2/2005 | Sporck et al. |
| 6,690,185 B1 | 2/2004 | Khandros et al. | | 6,859,054 B1 * | 2/2005 | Zhou et al. .................. 324/754 |
| 6,701,265 B2 | 3/2004 | Hill et al. | | 6,862,727 B2 | 3/2005 | Stevens |
| 6,701,612 B2 | 3/2004 | Khandros et al. | | 6,864,105 B2 | 3/2005 | Grube et al. |
| 6,707,548 B2 | 3/2004 | Kreimer et al. | | 6,864,694 B2 | 3/2005 | McTigue |
| 6,708,403 B2 | 3/2004 | Beaman et al. | | 6,870,359 B1 | 3/2005 | Sekel |
| 6,710,798 B1 | 3/2004 | Hershel et al. | | 6,870,381 B2 | 3/2005 | Grube |
| 6,713,374 B2 | 3/2004 | Eldridge et al. | | 6,882,239 B2 | 4/2005 | Miller |
| 6,714,828 B2 | 3/2004 | Eldridge et al. | | 6,882,546 B2 | 4/2005 | Miller |
| 6,717,426 B2 | 4/2004 | Iwasaki | | 6,887,723 B1 | 5/2005 | Ondricek et al. |
| 6,720,501 B1 | 4/2004 | Henson | | 6,888,362 B2 | 5/2005 | Eldridge et al. |
| 6,722,032 B2 | 4/2004 | Beaman et al. | | 6,891,385 B2 | 5/2005 | Miller |
| 6,724,205 B1 | 4/2004 | Hayden et al. | | 6,900,646 B2 | 5/2005 | Kasukabe et al. |
| 6,724,928 B1 | 4/2004 | Davis | | 6,900,647 B2 | 5/2005 | Yoshida et al. |
| 6,727,579 B1 | 4/2004 | Eldridge et al. | | 6,900,652 B2 | 5/2005 | Mazur |
| 6,727,580 B1 | 4/2004 | Eldridge et al. | | 6,900,653 B2 | 5/2005 | Yu et al. |
| 6,727,716 B1 | 4/2004 | Sharif | | 6,902,416 B2 | 6/2005 | Feldman |
| 6,729,019 B2 | 5/2004 | Grube et al. | | 6,902,941 B2 | 6/2005 | Sun |
| 6,731,804 B1 | 5/2004 | Carrieri et al. | | 6,903,563 B2 | 6/2005 | Yoshida et al. |
| 6,734,687 B1 | 5/2004 | Ishitani et al. | | 6,906,506 B1 | 6/2005 | Reano et al. |
| 6,737,920 B2 | 5/2004 | Jen et al. | | 6,906,539 B2 | 6/2005 | Wilson et al. |
| 6,741,085 B1 | 5/2004 | Khandros et al. | | 6,906,542 B2 | 6/2005 | Sakagawa et al. |
| 6,741,092 B2 | 5/2004 | Eldridge et al. | | 6,906,543 B2 | 6/2005 | Lou et al. |
| 6,741,129 B1 | 5/2004 | Corsi et al. | | 6,907,149 B2 | 6/2005 | Slater |
| 6,744,268 B2 | 6/2004 | Hollman | | 6,908,364 B2 | 6/2005 | Back et al. |
| 6,753,679 B1 | 6/2004 | Kwong et al. | | 6,909,297 B2 | 6/2005 | Ji et al. |
| 6,753,699 B2 | 6/2004 | Stockstad | | 6,909,300 B2 | 6/2005 | Lu et al. |
| 6,759,311 B2 | 7/2004 | Eldridge et al. | | 6,909,983 B2 | 6/2005 | Sutherland |
| 6,759,859 B2 | 7/2004 | Deng et al. | | 6,910,268 B2 | 6/2005 | Miller |
| 6,764,869 B2 | 7/2004 | Eldridge et al. | | 6,911,814 B2 | 6/2005 | Miller et al. |
| 6,768,328 B2 | 7/2004 | Self et al. | | 6,911,826 B2 | 6/2005 | Plotnikov et al. |
| 6,770,955 B1 | 8/2004 | Coccioli et al. | | 6,911,834 B2 | 6/2005 | Mitchell et al. |
| 6,771,806 B1 | 8/2004 | Satya et al. | | 6,911,835 B2 | 6/2005 | Chraft et al. |

| | | | | | | |
|---|---|---|---|---|---|---|
| 6,912,468 B2 | 6/2005 | Marin et al. | | 7,019,544 B1 | 3/2006 | Jacobs et al. |
| 6,913,468 B2 | 7/2005 | Dozier, II et al. | | 7,019,701 B2 | 3/2006 | Ohno et al. |
| 6,914,244 B2 | 7/2005 | Alani | | 7,020,360 B2 | 3/2006 | Satomura et al. |
| 6,914,427 B2 | 7/2005 | Gifford et al. | | 7,020,363 B2 | 3/2006 | Johannessen |
| 6,914,430 B2 | 7/2005 | Hasegawa et al. | | 7,022,976 B1 | 4/2006 | Santana, Jr. et al. |
| 6,914,580 B2 | 7/2005 | Leisten | | 7,022,985 B2 | 4/2006 | Knebel et al. |
| 6,917,195 B2 | 7/2005 | Hollman | | 7,023,225 B2 | 4/2006 | Blackwood |
| 6,917,210 B2 | 7/2005 | Miller | | 7,023,226 B2 | 4/2006 | Okumura et al. |
| 6,917,211 B2 | 7/2005 | Yoshida et al. | | 7,023,231 B2 | 4/2006 | Howland, Jr. et al. |
| 6,917,525 B2 | 7/2005 | Mok et al. | | 7,025,628 B2 | 4/2006 | LaMeres et al. |
| 6,919,732 B2 * | 7/2005 | Yoshida et al. ............... 324/754 | | 7,026,832 B2 | 4/2006 | Chaya et al. |
| 6,922,069 B2 | 7/2005 | Jun | | 7,026,833 B2 | 4/2006 | Rincon et al. |
| 6,924,653 B2 | 8/2005 | Schaeffer et al. | | 7,026,834 B2 | 4/2006 | Hwang |
| 6,924,655 B2 | 8/2005 | Kirby | | 7,026,835 B2 | 4/2006 | Farnworth et al. |
| 6,927,078 B2 | 8/2005 | Saijo et al. | | 7,030,328 B1 | 4/2006 | Beerling |
| 6,927,079 B1 | 8/2005 | Fyfield | | 7,030,599 B2 | 4/2006 | Douglas |
| 6,927,586 B2 | 8/2005 | Thiessen | | 7,030,827 B2 | 4/2006 | Mahler et al. |
| 6,927,587 B2 | 8/2005 | Yoshioka | | 7,032,307 B2 | 4/2006 | Matsunaga et al. |
| 6,927,598 B2 | 8/2005 | Lee et al. | | 7,034,553 B2 | 4/2006 | Gilboe |
| 6,930,498 B2 | 8/2005 | Tervo et al. | | 7,035,738 B2 | 4/2006 | Matsumoto et al. |
| 6,933,713 B2 | 8/2005 | Cannon | | 7,057,404 B2 | 6/2006 | Gleason et al. |
| 6,933,717 B1 | 8/2005 | Dogaru et al. | | 7,071,722 B2 | 7/2006 | Yamada et al. |
| 6,933,725 B2 | 8/2005 | Lim et al. | | 7,088,981 B2 | 8/2006 | Chang |
| 6,933,736 B2 | 8/2005 | Kobayashi et al. | | 7,091,729 B2 * | 8/2006 | Kister ....................... 324/754 |
| 6,933,737 B2 | 8/2005 | Sugawara | | 7,096,133 B1 | 8/2006 | Martin et al. |
| 6,937,020 B2 | 8/2005 | Munson et al. | | 7,161,363 B2 | 1/2007 | Gleason et al. |
| 6,937,037 B2 | 8/2005 | Eldridge et al. | | 7,173,433 B2 | 2/2007 | Hoshi et al. |
| 6,937,040 B2 | 8/2005 | Maeda et al. | | 7,187,188 B2 | 3/2007 | Andrews et al. |
| 6,937,042 B2 | 8/2005 | Yoshida et al. | | 7,188,037 B2 | 3/2007 | Hidehira |
| 6,937,045 B2 | 8/2005 | Sinclair | | 7,219,416 B2 | 5/2007 | Inoue et al. |
| 6,937,341 B1 | 8/2005 | Woollam et al. | | 7,233,160 B2 | 6/2007 | Hayden et al. |
| 6,940,264 B2 | 9/2005 | Ryken, Jr. et al. | | 7,253,646 B2 | 8/2007 | Lou et al. |
| 6,940,283 B2 | 9/2005 | McQueeney | | 7,271,603 B2 | 9/2007 | Gleason et al. |
| 6,943,563 B2 | 9/2005 | Martens | | 7,276,922 B2 | 10/2007 | Miller et al. |
| 6,943,571 B2 | 9/2005 | Worledge | | 7,315,175 B2 | 1/2008 | Cole |
| 6,943,574 B2 | 9/2005 | Altmann et al. | | 7,319,335 B2 | 1/2008 | Brunner et al. |
| 6,944,380 B1 | 9/2005 | Hideo et al. | | 7,319,337 B2 | 1/2008 | Sakata |
| 6,946,859 B2 | 9/2005 | Karavakis et al. | | 7,323,680 B2 | 1/2008 | Chong |
| 6,946,860 B2 | 9/2005 | Cheng et al. | | 7,323,899 B2 | 1/2008 | Schuette et al. |
| 6,946,864 B2 | 9/2005 | Gramann et al. | | 7,327,153 B2 | 2/2008 | Weinraub |
| 6,948,391 B2 | 9/2005 | Brassell et al. | | 7,332,918 B2 | 2/2008 | Sugiyama et al. |
| 6,948,981 B2 | 9/2005 | Pade | | 7,332,923 B2 | 2/2008 | Schott et al. |
| 6,949,942 B2 | 9/2005 | Eldridge et al. | | 7,342,402 B2 | 3/2008 | Kim et al. |
| 6,970,001 B2 | 11/2005 | Chheda et al. | | 7,403,028 B2 | 7/2008 | Campbell |
| 6,987,483 B2 | 1/2006 | Tran | | 7,427,868 B2 | 9/2008 | Strid et al. |
| 7,001,785 B1 | 2/2006 | Chen | | 2001/0002794 A1 | 6/2001 | Draving et al. |
| 7,002,133 B2 | 2/2006 | Beausoleil et al. | | 2001/0009061 A1 | 7/2001 | Gleason et al. |
| 7,002,363 B2 | 2/2006 | Mathieu | | 2001/0009377 A1 | 7/2001 | Schwindt et al. |
| 7,002,364 B2 | 2/2006 | Kang et al. | | 2001/0010468 A1 | 8/2001 | Gleason et al. |
| 7,003,184 B2 | 2/2006 | Ronnekleiv et al. | | 2001/0020283 A1 | 9/2001 | Sakaguchi |
| 7,005,842 B2 | 2/2006 | Fink et al. | | 2001/0024116 A1 | 9/2001 | Draving |
| 7,005,868 B2 | 2/2006 | McTigue | | 2001/0030549 A1 | 10/2001 | Gleason et al. |
| 7,005,879 B1 | 2/2006 | Robertazzi | | 2001/0043073 A1 | 11/2001 | Montoya |
| 7,006,046 B2 | 2/2006 | Aisenbrey | | 2001/0044152 A1 | 11/2001 | Burnett |
| 7,007,380 B2 | 3/2006 | Das et al. | | 2001/0045511 A1 | 11/2001 | Moore et al. |
| 7,009,188 B2 | 3/2006 | Wang | | 2001/0054906 A1 | 12/2001 | Fujimura |
| 7,009,383 B2 | 3/2006 | Harwood et al. | | 2002/0005728 A1 | 1/2002 | Babson et al. |
| 7,009,415 B2 | 3/2006 | Kobayashi et al. | | 2002/0008533 A1 | 1/2002 | Ito et al. |
| 7,011,531 B2 | 3/2006 | Egitto et al. | | 2002/0009377 A1 | 1/2002 | Shafer |
| 7,012,425 B2 | 3/2006 | Shoji | | 2002/0009378 A1 | 1/2002 | Obara |
| 7,012,441 B2 | 3/2006 | Chou et al. | | 2002/0011859 A1 | 1/2002 | Smith et al. |
| 7,013,221 B1 | 3/2006 | Friend et al. | | 2002/0011863 A1 | 1/2002 | Takahashi et al. |
| 7,014,499 B2 | 3/2006 | Yoon | | 2002/0030480 A1 | 3/2002 | Appen et al. |
| 7,015,455 B2 | 3/2006 | Mitsuoka et al. | | 2002/0050828 A1 | 5/2002 | Seward, IV et al. |
| 7,015,689 B2 | 3/2006 | Kasajima et al. | | 2002/0070743 A1 | 6/2002 | Felici et al. |
| 7,015,690 B2 | 3/2006 | Wang et al. | | 2002/0070745 A1 | 6/2002 | Johnson et al. |
| 7,015,703 B2 | 3/2006 | Hopkins et al. | | 2002/0079911 A1 | 6/2002 | Schwindt |
| 7,015,707 B2 | 3/2006 | Cherian | | 2002/0105396 A1 | 8/2002 | Streeter et al. |
| 7,015,708 B2 | 3/2006 | Beckous et al. | | 2002/0109088 A1 | 8/2002 | Nara et al. |
| 7,015,709 B2 | 3/2006 | Capps et al. | | 2002/0118034 A1 | 8/2002 | Laureanti |
| 7,015,710 B2 | 3/2006 | Yoshida et al. | | 2002/0149377 A1 | 10/2002 | Hefti et al. |
| 7,015,711 B2 | 3/2006 | Rothaug et al. | | 2002/0153909 A1 | 10/2002 | Petersen et al. |
| 7,019,541 B2 | 3/2006 | Kittrell | | 2002/0163769 A1 | 11/2002 | Brown |

| | | | | | | |
|---|---|---|---|---|---|---|
| 2002/0168659 A1 | 11/2002 | Hefti et al. | | 2005/0184742 A1 | 8/2005 | Huang et al. |
| 2002/0176160 A1 | 11/2002 | Suzuki et al. | | 2005/0195124 A1 | 9/2005 | Puente Baliarda et al. |
| 2002/0180466 A1 | 12/2002 | Hiramatsu et al. | | 2005/0229053 A1 | 10/2005 | Sunter |
| 2002/0197709 A1 | 12/2002 | Van der Weide et al. | | 2005/0236587 A1 | 10/2005 | Kodama et al. |
| 2003/0010877 A1 | 1/2003 | Landreville et al. | | 2005/0237102 A1 | 10/2005 | Tanaka |
| 2003/0030822 A1 | 2/2003 | Finarov | | 2006/0030060 A1 | 2/2006 | Noguchi et al. |
| 2003/0032000 A1 | 2/2003 | Liu et al. | | 2006/0052075 A1 | 3/2006 | Galivanche et al. |
| 2003/0040004 A1 | 2/2003 | Hefti et al. | | 2006/0155270 A1 | 7/2006 | Hancock et al. |
| 2003/0057513 A1 | 3/2003 | Leedy | | 2006/0184041 A1 | 8/2006 | Andrews et al. |
| 2003/0062915 A1 | 4/2003 | Arnold et al. | | 2006/0220663 A1 | 10/2006 | Oikawa |
| 2003/0072549 A1 | 4/2003 | Facer et al. | | 2006/0226864 A1 | 10/2006 | Kramer |
| 2003/0076585 A1 | 4/2003 | Ledley | | 2007/0024506 A1 | 2/2007 | Hardacker |
| 2003/0077649 A1 | 4/2003 | Cho et al. | | 2007/0030021 A1 | 2/2007 | Cowan et al. |
| 2003/0088180 A1 | 5/2003 | Van Veen et al. | | 2007/0145989 A1 | 6/2007 | Zhu et al. |
| 2003/0119057 A1 | 6/2003 | Gascoyne et al. | | 2008/0111571 A1 | 5/2008 | Smith et al. |
| 2003/0139662 A1 | 7/2003 | Seidman | | | | |
| 2003/0139790 A1 | 7/2003 | Ingle et al. | | FOREIGN PATENT DOCUMENTS | | |
| 2003/0155939 A1 | 8/2003 | Lutz et al. | | CN | 1083975 | 3/1994 |
| 2003/0170898 A1 | 9/2003 | Gundersen et al. | | DD | 288234 | 3/1991 |
| 2003/0184332 A1 | 10/2003 | Tomimatsu et al. | | DE | 2951072 | 7/1981 |
| 2003/0215966 A1 | 11/2003 | Rolda et al. | | DE | 3426565 | 1/1986 |
| 2003/0234659 A1 | 12/2003 | Zieleman | | DE | 3637549 | 5/1988 |
| 2004/0015060 A1 | 1/2004 | Samsoondar et al. | | DE | 4223658 | 1/1993 |
| 2004/0021475 A1 | 2/2004 | Ito et al. | | DE | 9313420 | 10/1993 |
| 2004/0029425 A1 | 2/2004 | Yean et al. | | DE | 19522774 | 1/1997 |
| 2004/0061514 A1 | 4/2004 | Schwindt et al. | | DE | 19542955 | 5/1997 |
| 2004/0066181 A1 | 4/2004 | Thies | | DE | 19618717 | 1/1998 |
| 2004/0069776 A1 | 4/2004 | Fagrell et al. | | DE | 19749687 | 5/1998 |
| 2004/0090223 A1 | 5/2004 | Yonezawa | | DE | 29809568 | 10/1998 |
| 2004/0095145 A1 | 5/2004 | Boudiaf et al. | | DE | 10000324 | 7/2001 |
| 2004/0095641 A1 | 5/2004 | Russum et al. | | DE | 20220754 | 5/2004 |
| 2004/0100276 A1 | 5/2004 | Fanton | | EP | 0230766 | 12/1985 |
| 2004/0100297 A1 | 5/2004 | Tanioka et al. | | EP | 0195520 | 9/1986 |
| 2004/0108847 A1 | 6/2004 | Stoll et al. | | EP | 0230348 | 7/1987 |
| 2004/0113640 A1 | 6/2004 | Cooper et al. | | EP | 0259163 | 3/1988 |
| 2004/0130787 A1 | 7/2004 | Thome-Forster et al. | | EP | 0259183 | 3/1988 |
| 2004/0132222 A1 | 7/2004 | Hembree et al. | | EP | 0259942 | 3/1988 |
| 2004/0134899 A1 | 7/2004 | Hiramatsu et al. | | EP | 0261986 | 3/1988 |
| 2004/0140819 A1 | 7/2004 | McTigue et al. | | EP | 0270422 | 6/1988 |
| 2004/0147034 A1 | 7/2004 | Gore et al. | | EP | 0333521 | 9/1989 |
| 2004/0162689 A1 | 8/2004 | Jamneala et al. | | EP | 0460911 | 12/1991 |
| 2004/0170312 A1 | 9/2004 | Soenksen | | EP | 0846476 | 6/1998 |
| 2004/0175294 A1 | 9/2004 | Ellison et al. | | EP | 0 945 736 | 9/1999 |
| 2004/0186382 A1 | 9/2004 | Modell et al. | | EP | 0945736 | 9/1999 |
| 2004/0193382 A1 | 9/2004 | Adamian et al. | | GB | 579665 | 8/1946 |
| 2004/0197771 A1 | 10/2004 | Powers et al. | | GB | 2014315 | 8/1979 |
| 2004/0199350 A1 | 10/2004 | Blackham et al. | | GB | 2179458 | 3/1987 |
| 2004/0201388 A1 | 10/2004 | Barr | | JP | 52-19046 | 2/1977 |
| 2004/0207072 A1 | 10/2004 | Hiramatsu et al. | | JP | 53-037077 | 4/1978 |
| 2004/0207424 A1 | 10/2004 | Hollman | | JP | 53037077 | 4/1978 |
| 2004/0239338 A1 | 12/2004 | Johnsson et al. | | JP | 53-052354 | 5/1978 |
| 2004/0246004 A1 | 12/2004 | Heuermann | | JP | 55-115383 | 9/1980 |
| 2004/0251922 A1 | 12/2004 | Martens et al. | | JP | 55115383 | 9/1980 |
| 2005/0024069 A1 | 2/2005 | Hayden et al. | | JP | 56-007439 | 1/1981 |
| 2005/0026276 A1 | 2/2005 | Chou | | JP | 56-88333 | 7/1981 |
| 2005/0030047 A1 | 2/2005 | Adamian | | JP | 5691503 | 7/1981 |
| 2005/0054029 A1 | 3/2005 | Tomimatsu et al. | | JP | 56088333 | 7/1981 |
| 2005/0062533 A1 | 3/2005 | Vice | | JP | 57-075480 | 5/1982 |
| 2005/0068054 A1 | 3/2005 | Mok et al. | | JP | 57075480 | 5/1982 |
| 2005/0083130 A1 | 4/2005 | Grilo | | JP | 57-163035 | 10/1982 |
| 2005/0088191 A1 | 4/2005 | Lesher | | JP | 57163035 | 10/1982 |
| 2005/0101846 A1 | 5/2005 | Fine et al. | | JP | 57171805 | 10/1982 |
| 2005/0116730 A1 | 6/2005 | Hsu | | JP | 58-130602 | 8/1983 |
| 2005/0142033 A1 | 6/2005 | Glezer et al. | | JP | 594189 U | 1/1984 |
| 2005/0151548 A1 | 7/2005 | Hayden et al. | | JP | 60-5462 | 4/1984 |
| 2005/0156675 A1 | 7/2005 | Rohde et al. | | JP | 60-236241 | 11/1985 |
| 2005/0164160 A1 | 7/2005 | Gunter et al. | | JP | 61142802 | 6/1986 |
| 2005/0165316 A1 | 7/2005 | Lowery et al. | | JP | 62-11243 | 1/1987 |
| 2005/0168722 A1 | 8/2005 | Forstner et al. | | JP | 62-51235 | 3/1987 |
| 2005/0172703 A1* | 8/2005 | Kley ............... 73/105 | | JP | 62-58650 | 3/1987 |
| 2005/0174191 A1 | 8/2005 | Brunker et al. | | JP | 62-098634 | 5/1987 |
| 2005/0178980 A1 | 8/2005 | Skidmore et al. | | JP | 62-107937 | 5/1987 |
| 2005/0179444 A1* | 8/2005 | Tiemeijer ............... 324/637 | | | | |

| | | |
|---|---|---|
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO 00/73905 | 12/2000 |
| WO | WO01/07207 | 1/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF), Software," MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolor Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, p. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W- Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

The Micromanipulator Company, data sheet, Double Sided Probing System, Jul. 2002, 2 pages.

Bob Stengel, "Neutralized Differential Amplifiers using Mixed-Mode s-parameters," 2003 IEEE Radio Frequency Integrated Circuits Symposium, pp. 711-714.

* cited by examiner

CALIBRATION STRUCTURES FOR DIFFERENTIAL SIGNAL PROBING

CROSS-REFERENCE TO RELATED APPLICATIONS

This application claims the benefit of U.S. Provisional Application No. 60/813,121, filed Jun. 12, 2006.

BACKGROUND OF THE INVENTION

The present invention relates to integrated circuits and, more particularly, to structures for calibrating probing systems that utilize differential signals to inspect integrated circuits and other microelectronic devices.

Integrated circuits (ICs) are economically attractive because large numbers of often complex circuits, for example microprocessors, can be inexpensively fabricated on the surface of a wafer or substrate. Following fabrication, individual dies, including one or more circuits, are separated or singulated and encased in a package that provides for electrical connections between the exterior of the package and the circuit on the enclosed die. The separation and packaging of a die comprises a significant portion of the cost of manufacturing the integrated circuit device and to monitor and control the IC fabrication process and avoid the cost of packaging defective dies, manufacturers commonly add electrical circuits or test structures to the wafer to enable "probing", on-wafer testing to verify the characteristics of the integrated circuits, before the dies are singulated.

A test structure typically includes a device-under-test (DUT), a plurality of metallic bond or probe pads that are deposited at the wafer's surface and a plurality of conductive vias that connect the probe pads to the DUT which is typically fabricated beneath the surface of the wafer. The DUT typically comprises a simple circuit that includes a copy of one or more of the basic elements of the marketable integrated circuits fabricated on the wafer, such as a single line of conducting material, a chain of vias or a single transistor. The circuit elements of the DUT are typically produced with the same process and in the same layers of the die as the corresponding elements of the integrated circuit. The ICs are typically characterized "on-wafer" by applying a test instrument generated signal to the test structure and measuring the response of the test structure to the signal. Since the circuit elements of the DUT are fabricated with the same process as the corresponding elements of the integrated circuit, the electrical properties of the DUT are expected to be representative of the electrical properties of the corresponding components of the integrated circuits.

At higher frequencies, on-wafer characterization is commonly performed with a network analyzer. The network analyzer comprises a source of an AC signal, commonly, a radio frequency (RF) signal, that is used to stimulate the DUT of a test structure. A forward-reverse switch directs the stimulating signals to one or more of the probe pads of the test structure. Directional couplers or bridges pick off the forward or reverse waves traveling to or from the test structure. These signals are down-converted by intermediate frequency (IF) sections of the network analyzer where the signals are filtered, amplified and digitized for further processing and display. The preferred interconnection for communicating the signals between the signal source and the signal sink of the network analyzer and the test structure is coaxial cable. The transition between the coaxial cable and the probe pads of the test structure is preferably provided by a movable probe having one or more conductive probe tips that are arranged to be co-locatable with the probe pads of the test structure. The network analyzer and the test structure can be temporarily interconnected by bringing the probe tips into contact with the probe pads of the test structure.

The probe functions as an adapter enabling the signals to transition between the coaxial cable connecting the probe to the network analyzer and the coplanar waveguides of the probe pads. As a result of the transitions from one form of transmission line to another, the probe will perturb high frequency signals transmitted to and from the network analyzer. Relatively accurate measurements can be made with a network analyzer and probe system if the system is calibrated to remove the signal perturbations caused by the interconnection of the network analyzer and the test structure and, in some cases, perturbations caused by components of the test structure. Probing systems are typically calibrated by interconnecting the network analyzer and a calibration structure and stimulating the calibration structure with a test signal. Calibration structures typically comprise one or more conductive contact areas or probe pad regions arranged to spatially conform to the probe tips of the probe(s) to be calibrated. The probe pad regions are interconnected, in various combinations, by a conductive or non-conductive calibration element. Deviations from the ideal response to the stimulating signal are stored in the network analyzer. In a process known as "de-embedding," the data is used to mathematically compensate for the effect of the probe, or, in some cases, elements of the test structure, when probing a test structure on a wafer.

Most test instrumentation utilizes ground referenced or single ended signals for stimulating the test structure and measuring the response to the stimulation. At higher frequencies noise and interference induced by adjacent circuitry and uncertainty concerning the ground potential often make the integrity of single ended signals inadequate. For example, integrated circuits typically have a ground plane at the lower surface of the substrate on which the active and passive devices of the circuit are fabricated. The terminals of transistors fabricated on a semi-conductive substrate are typically capacitively interconnected, through the substrate, to the ground plane. The impedance of this parasitic interconnection is frequency dependent and at higher frequencies the ground potential and the true nature of single ended signals becomes uncertain.

Differential signals, on the other hand, are transmitted on two conductors which carry inverted copies of the signal waveform and the value of the signal is the difference between the waveforms on the respective conductors. Noise typically effects both conductors equally and this common mode noise or signal is cancelled when the value of the signal is determined from the difference between the waveforms. In addition, the two waveforms are mutual references enabling greater certainty in determining the transition from one value to the other in binary devices and enabling a faster transition between binary values with a reduced voltage swing for the signal. Differential signaling enables a reduction in signal power, an increase in data rate and greater immunity from noise from sources such as power supplies, adjacent circuitry and external sources.

Test structures comprising differential gain cells require five connections to the test instrumentation. The two components of the differential input signal or a common mode signal is transmitted by the network analyzer to two of the probe pads of the test structure and the two components of the differential output signal are transmitted from two other probe pads of the test structure to the network analyzer. At least one additional probe pad of the test structure enables biasing of the transistors of the differential gain cell. Test structures for differential signal probing are, typically, interconnected to the network analyzer with two probes and, correspondingly, calibration structures for differential signal probes provide for simultaneous contact by the tips of two probes. However, a test structure and probe comprising a linear array of probe pads and probe tips permits a differential test structure to be fabricated in a saw street between dies increasing the surface area of the substrate available for the fabrication of marketable ICs.

What is desired are calibration structures for calibrating a differential signal probe having a linear array of contact tips.

DETAILED DESCRIPTION OF PREFERRED EMBODIMENTS

Figure 1:
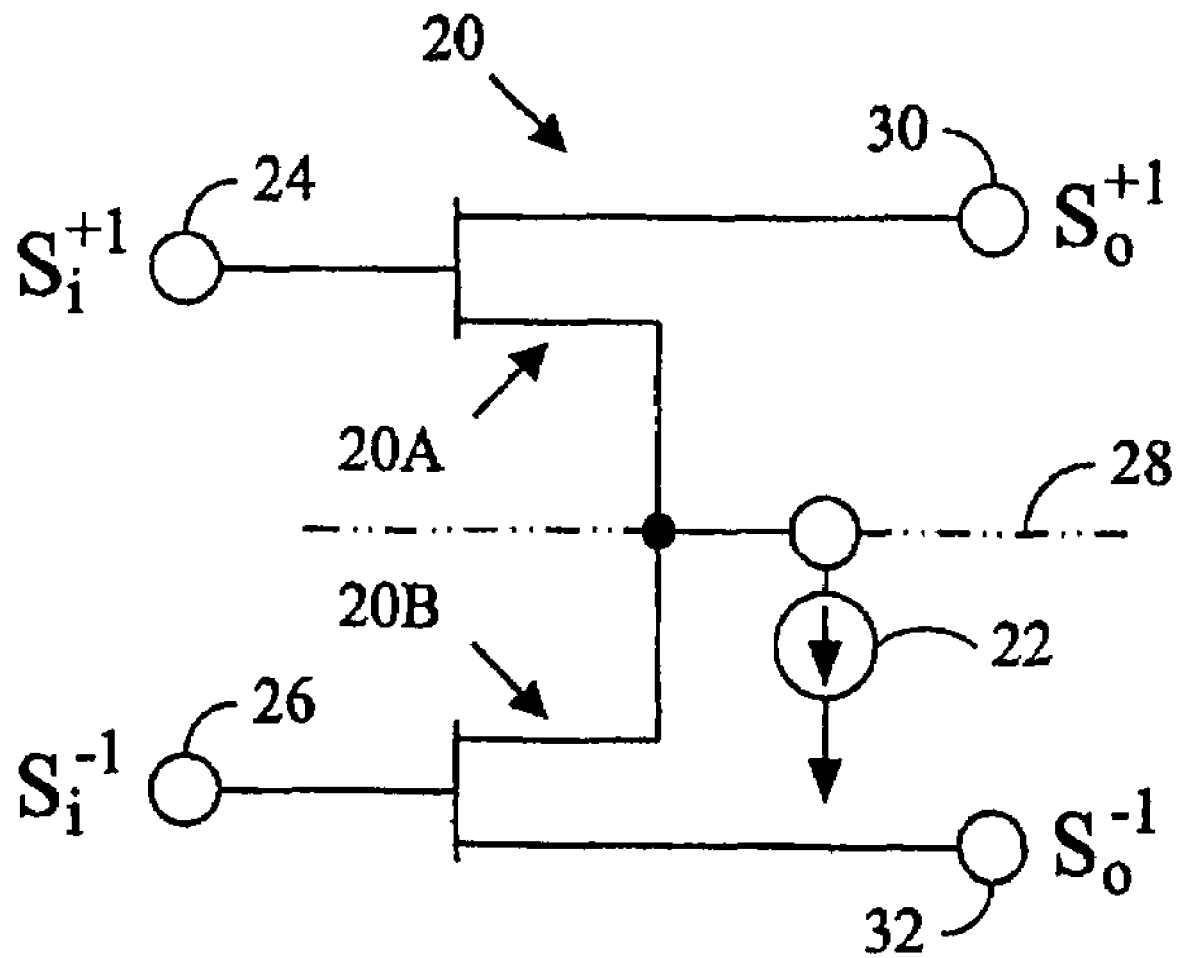
FIG. 1 is schematic diagram of a balanced differential gain cell.

Referring in detail to the drawings where similar parts are identified by like reference numerals, and, more particularly to FIG. 1, a differential gain cell 20 is a balanced device comprising two nominally identical circuit halves 20A, 20B. When biased, with a DC current source 22, and stimulated with a differential mode signal comprising even and odd mode components of equal amplitude and opposite phase ($S_i^{+1}$ and $S_i^{-1}$) 24, 26, a virtual ground is established at the symmetrical axis 28 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor radio frequency (RF) grounding better than circuits operated with single ended signals. In addition, noise from external sources, such as adjacent conductors, tends to couple, electrically and electromagnetically, in the common mode and cancel in the differential mode. As a result, balanced or differential circuits have good immunity to noise including noise at even-harmonic frequencies since signals that are of opposite phase at the fundamental frequency are in phase at the even harmonics. Two probes are typically required to conduct the DC bias 22, the phase or even mode ($S_i^{+1}$) 24, and the anti-phase or odd mode ($S_i^{-1}$) 26 portions of a differential input signals to the differential device and to conduct the even mode ($So^{+1}$) 30 and odd mode ($So^{-1}$) 32 components of a differential output signal from the device.

Figure 2:
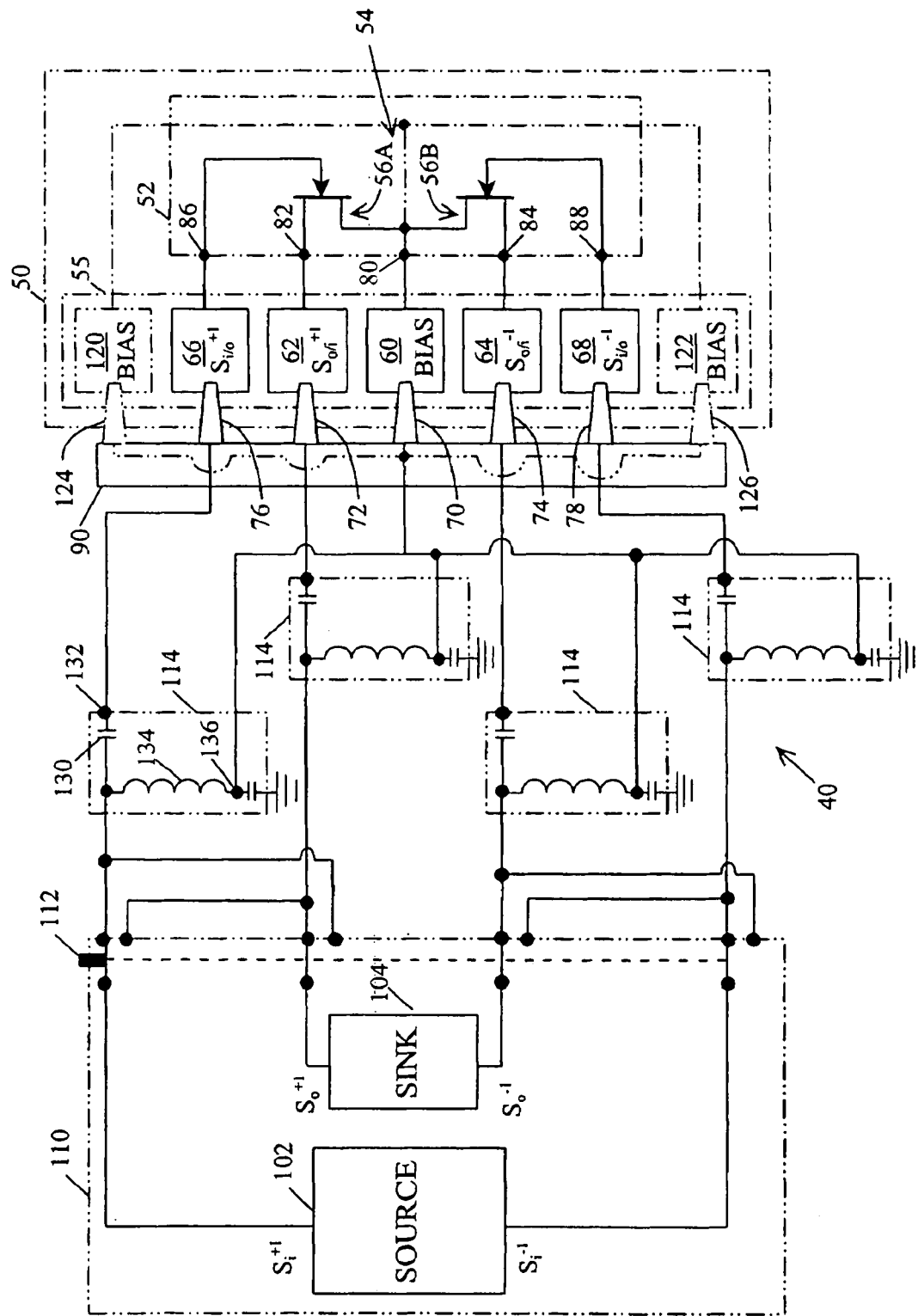
FIG. 2 is a schematic diagram of a differential signal test structure and a probing system.

Referring to FIG. 2, the differential test structure 50 comprises a device-under test (DUT) 52 and a linear array 55 of bond or probe pads. The DUT 52 includes a differential gain cell 54 that is responsive to a differential mode input signal comprising an even mode component ($S_i^{+1}$) and an odd mode component ($S_i^{-1}$) that has substantially the same amplitude as the even mode component but which is opposite in phase of the even mode component. The differential gain cell 54 comprises two substantially identical field effect (JFET) transistors 56A and 56B. However, the DUT typically comprises components corresponding to the components utilized in the marketable integrated circuits fabricated on a particular wafer and other types of transistors, such as bipolar junction (BJT) transistors or MOSFET transistors can be used in the construction of a differential gain cell.

The source terminals of the transistors 56A, 56B are interconnected as a bias terminal 80 of the device. The bias terminal is interconnected to a centrally located bias probe pad 60. The bias probe pad can be interconnected, typically through a contact tip 70 of a probe 90, to a source of direct current, for example a current mirror or a potential relative to ground, which provides the DC bias for the transistors of the differential gain cell. The gates of the transistors comprise a first pair of signal terminals 86, 88 of the DUT and are connected to respective signal probe pads 66, 68 which are, in turn, respectively connectible, typically through contact tips 76, 78 of the probe, to a test instrument 110. The drains of the transistors of the differential gain cell, comprise a second pair of signal terminals 82, 84 of the DUT, which are interconnected to respective signal probe pads 62, 64 which are connectible through contact tips 72, 74 of the probe to the test instrument.

Typically, a network analyzer comprises the test instrument 110. A network analyzer includes a source 102 of a differential mode signal comprising an even mode component, $S_i^{+1}$, and an odd mode component, $S_i^{-1}$. The network analyzer also comprises a sink 104 for the differential signals output by the DUT, $S_o^{+1}$ and $S_o^{-1}$. A reversing switch 112 enables reversing the connections between the test instrument's source and sink for the differential test signals and the respective pairs of signal probe pads. With the reversing switch in the illustrated position, the components of the differential input signals ($S_i^{+1}$ and $S_i^{-1}$) are applied to probe pads 66 and 68 and sunk at the terminals 86 and 88 of the DUT and the output signals ($S_o^{+1}$ and $S_o^{-1}$) are sourced from the terminals 82 and 84 through the probe pads 62 and 64. By actuating the reversing switch, the input signals ($S_i^{+1}$ and $S_i^{-1}$) can be applied to probe pads 62 and 64 sinking the input signals at terminals 82 and 84. As a result, the output signal components ($S_o^{+1}$ and $S_o^{-1}$) are sourced from terminals 86 and 88 and transmitted from probe pads 66 and 68 to the sink of the test instrument. The operation of the test structure 50 is typically tested by launching a differential input signal to one pair of signal terminals of the differential gain cell and capturing the differential and common mode output signals transmitted, in response to the input signal, from the other pair of signal terminals.

The source 102 of the test instrument can output a radio frequency (RF) signal with a DC offset, including a ground potential. The DUT is commonly biased with the DC portion of the input signal ($S_i$). Bias tees 114 comprising a capacitor 130 in series the an RF port 132 and an inductor 134 in series with a DC port 136 are connected to each of the conductors connecting the signal probe tips and the test instrument. The capacitor blocks the transmission of DC from the RF port of the bias tee enabling transmission of the modulated portion of the input signal to the respective pairs of signal probe pads. The inductor blocks the modulated portion of the input signal from the DC port of the bias tee but permits the DC portion of the signal output by the source 102 to be conducted to the bias probe tip 70 and the bias terminal 80 to bias the transistors of the DUT.

The probe pads 60, 62, 64, 66, 68 of the test structure 50 are arranged in a substantially linear array 55, with the centroids of the respective probe pads arranged in a substantially, straight line. The linear array of probe pads enables fabrication of the probe pads of a differential test structure in a saw street between dies on a wafer. The test structure serves no function after the dies are singulated and fabrication of test structure in the saw street provides additional area on the surface of a wafer for fabricating dies comprising the marketable integrated circuits. In a second embodiment of the differential test structure, the linear array 55 of probe pads is extended by fabricating an additional probe pad 120 and 122 adjacent to the first 66 and fifth 68 probe pads, distal of the respective ends of the linear array five probe pads. The additional probe pads 120, 122 are interconnected to the DC bias through the bias terminal 80 and sixth 124 and seventh 126 probe tips which are connected to the central bias probe tip 70. The additional bias probe pads provide additional shielding for the signals transmitted to and from the test structure.

In another embodiment, the linear array of probe pads comprises six probe pads. The DUT is biased through probe pads 120 and 122 at the respective ends of a linear array comprising two pairs of signal probe pads 62 and 64 and 66 and 68.

Figure 3:
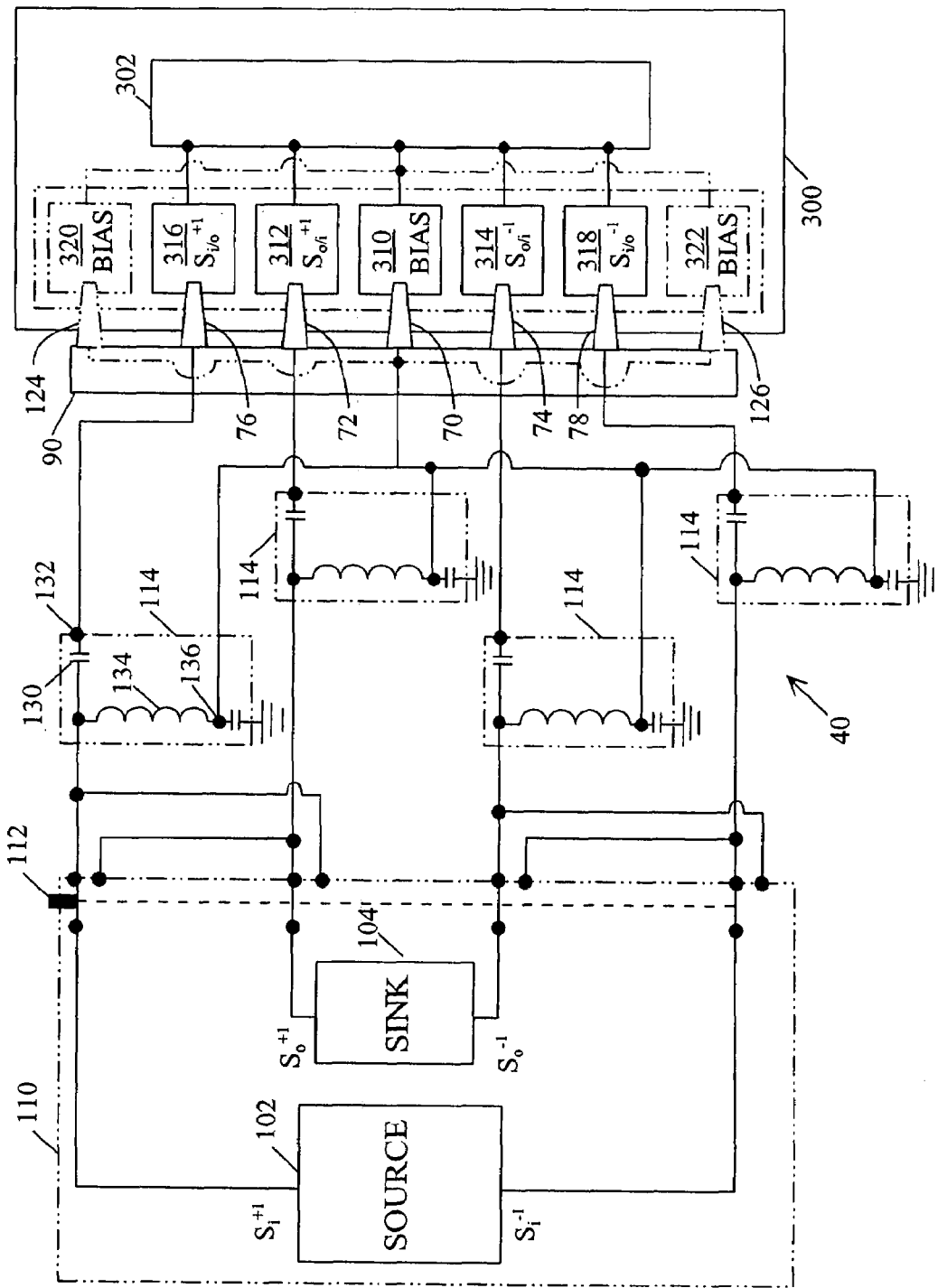
FIG. 3 is a schematic diagram of a probing system and calibration element for calibrating a probing system utilizing differential signals.
Figure 5:
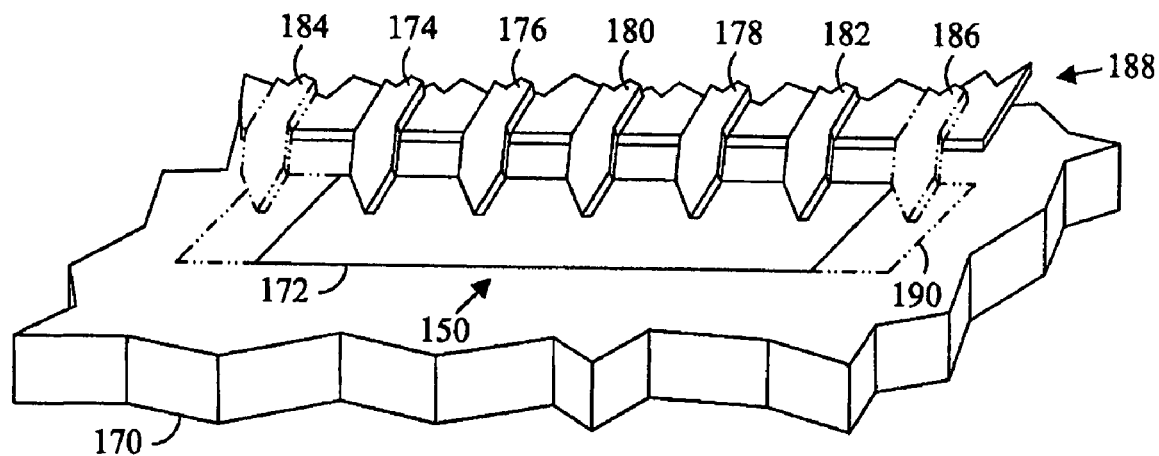
FIG. 5 is a perspective view of a grounded, "short" calibration structure fabricated on a portion of a calibration substrate.

Referring to FIG. 3, probing systems are typically calibrated by launching signals from the test instrument at a plurality of calibration structures that are successively engaged with the probe tips of the probe that will be used in the on-wafer inspection of test structures. Any deviation from the ideal response when a calibration structure is stimulated by a test signal is recorded. These deviations are utilized to mathematically account for signal perturbations introduced by the probing system when a test structure on a wafer is stimulated with the test signal. To calibrate the probing system 40, the probe tips of the probe 90 are engaged with contact regions 310, 312, 314, 316, 318 of one or more calibration structures 300. The calibration structures comprise contact regions arranged to be co-locatable with the probe tips of the probe to be calibrated and a calibration element 302 comprising a conductive, non-conductive or semi-conductive interconnection between two or more of the contact regions. The contact regions of the calibration structure 300 comprise a linear array of regions 310, 312, 314, 316, 318 having respective centroids arranged in a substantially straight line. Referring also to FIG. 5, the contact regions are arranged to enable co-location and engagement by a plurality of probe tips 174, 176, 178, 180, 182, 184, 186 having respective contact surfaces with centroids arranged in a substantially straight line. Two pairs of contact regions 312, 316 and 314, 318 are arranged for co-location with the signal probe tips of the probe and at least one contact region, for example the central region 310 is arranged for contact with the central bias probe tip of the probe. The contact regions may have other arrangements, for example, a linear array of seven contact regions with a central region, separating the two pairs of signal contact regions, arranged for contact with the bias probe tip and two additional contact regions 320, 322 respectively distal of the respective pairs of signal contact regions arranged for contact by additional bias probe tips 124, 126 of the probe. As an additional example, the calibration structure may comprise six contact regions with two pairs of signal contact regions immediately adjacent to each other at the center of the linear array and a pair to contact regions distal of the signal contact regions at the ends of the array for contact with respective bias probe tips. The calibration structures comprise a linear array of contact regions with one more bias contact regions arranged symmetrical with two or more pairs of signal contact regions. Signals are launched from the test instrument 110 to particular contact regions of the calibration structure and output signals sourced from contact regions of the calibration structure are sunk in the test instrument sink 104. Deviations from the expected output signals are recorded and used in correcting the raw results obtained during test structure testing.

Several different algorithms are used in calibrating probing systems. The names of the various algorithms generally reflect the construction of the plurality of calibration elements that are used during the calibration process. For example, the Short-Open-Load-Through (SOLT) algorithm utilizes a succession of calibration structures including a shorted interconnection, an open circuit, a loaded interconnection and a through interconnection between some or all of the contact tips of the probe. Similarly, a Line-Reflect-Match (LRM) algorithm utilizes calibration structures comprising a transmission line, a reflect and a match calibration element.

Figure 4:
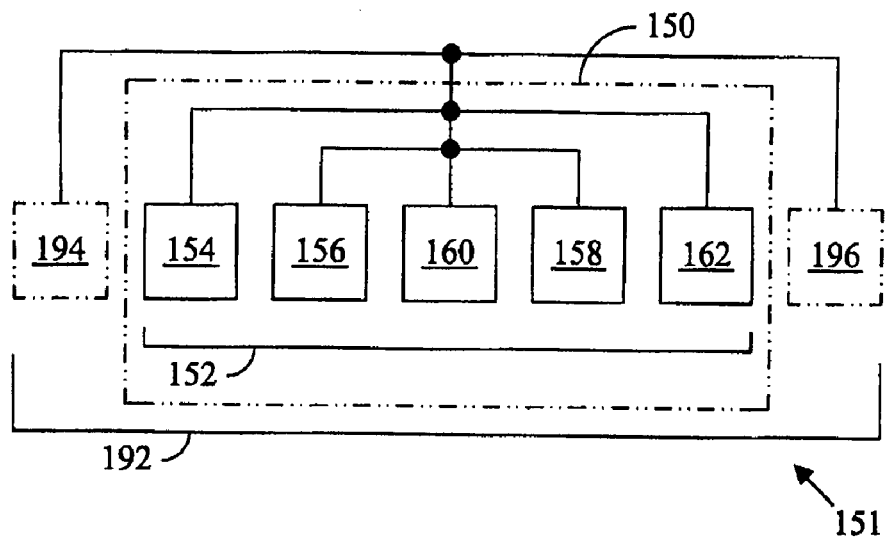
FIG. 4 is a schematic diagram of a grounded, "short" calibration structure.

Referring to FIG. 4, a grounded, "short" calibration structure 150 schematically comprises a linear array 152 (indicated by a bracket) of conductive regions or probe pads 154, 156, 158,160,162 that are spatially arranged to be co-locatable, respectively, with each of the contact areas of a linear array of probe tips of a probe that will be calibrated. The shorted calibration element comprises a plurality of short circuits interconnecting each of the conductive regions to the other conductive regions. The short calibration structure can be grounded by connecting the probe tip that engages the center conductive region 160 to ground during calibration. Referring to FIG. 5, calibration structures are typically fabricated by depositing conductive material on a substrate 170. The grounded "short" calibration structure 150 can be fabricated by depositing conductive material over a region 172 of sufficient dimensions to enable simultaneous contact by all of the contact tips 174, 176, 178, 180, 182 of a linear array of contact tips comprising a probe 188 that is to be calibrated. An extended conductive contact region 190 deposited on the substrate provides a grounded, short calibration structure 151 for a probe 188 having a linear array of six probe tips or a probe having additional "bias" probe tips 184, 186 that are respectively distal of the tips 174, 182 at the ends of the linear array of five probe tips. Schematically, the extended contact region appends conductive regions 184, 196 at the ends of the linear array 152 providing an extended linear array 192 for engagement by a probe having a linear arrangement of seven contact tips.

Figure 6:
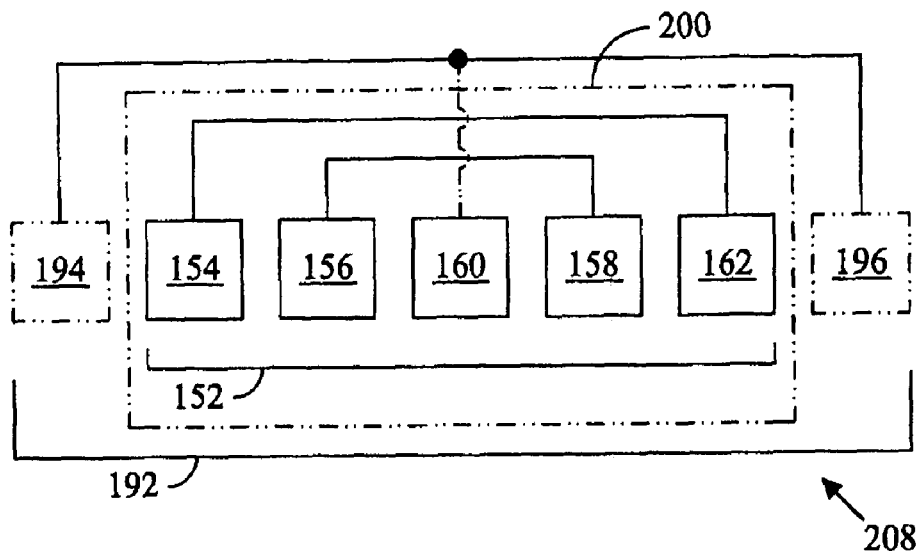
FIG. 6 is a schematic diagram of an ungrounded, "short" calibration structure.
Figure 7:
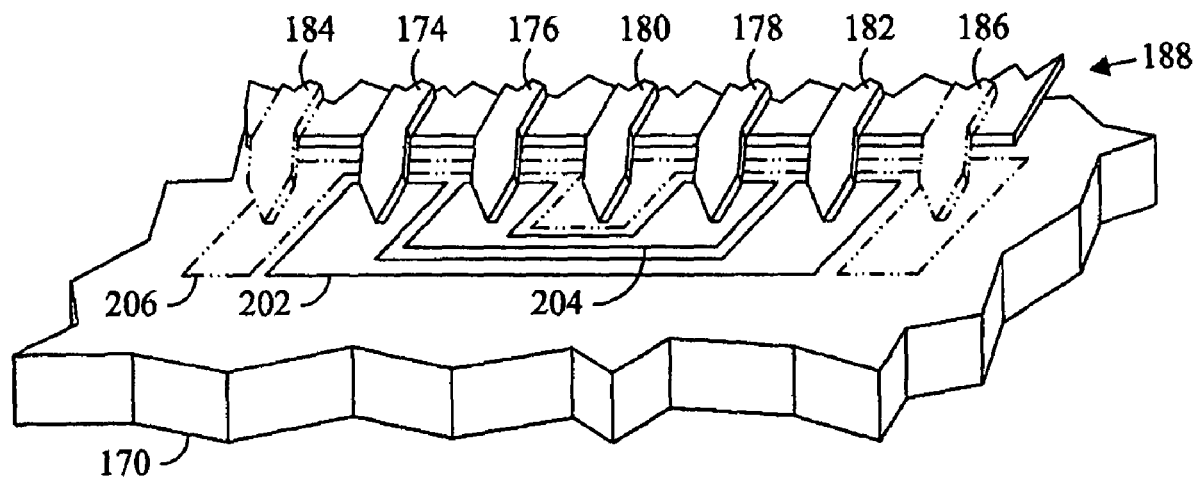
FIG. 7 is a perspective view of a ungrounded, "short" calibration structure.

Referring to FIG. 6, an ungrounded, "short" calibration structure 200 schematically comprises the linear array of five contact regions 152. The first 154 and the fifth 162 contact regions of the linear array, spatially corresponding to a pair of signal probe tips that conduct either the input signal or the output signal of the test structure, are interconnected by a calibration element comprising a short circuit. Likewise, a calibration element comprising a short circuit interconnects the second 156 and fourth 158 contact regions, engageable by a second pair of signal probe tips. The central conductive region 160 which engageable with the probe tip that biases the test structure and which may be connected to ground during calibration is not conductively interconnected to the regions engageable by the signal probe tips. Referring to FIG. 7, the ungrounded, short calibration structure 200 comprises a first conductive region 202 deposited on the substrate having interconnected portions spatially arranged to be co-locatable with the first 174 and fifth 182 contact tips of the linear of array of tips of the probe 188 and a second conductive region 204 having interconnected portions spatially arranged to be co-locatable with the second 176 and fourth 178 tips. The area of the substrate spatially co-locatable with center contact tip 180 is not conductively interconnected with the other conductive areas of the calibration structure.

An ungrounded, short calibration structure 208, for calibrating probes comprising a linear array of seven contact tips, a third conductive region 206 is deposited on the substrate. The third conductive region has interconnected portions spatially arranged for engagement by the center contact tip 180 and the contact tips 184, 186 distal of the ends of the five tip linear array of tips 174, 176, 180, 178, 182.

Figure 8:
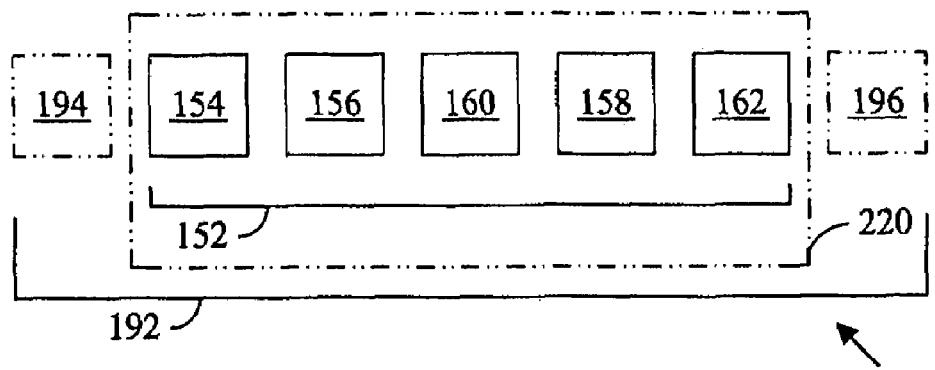
FIG. 8 is a schematic diagram of an "open" calibration structure.

Referring to FIG. 8, an "open" calibration structure 220 comprises a linear array 152 of five contact regions or, in the case of a seven tip probe, the "open" calibration structure 222 comprising seven contact regions 192, including contact regions 194, 196, which are each insulated from the others. While an open calibration structure can be fabricated on a substrate by providing a plurality of conductively disconnected contact regions, arranged to be spatially co-locatable with the contact tips of the probe to be calibrated, an "open" calibration is typically performed by raising the probe above the calibration substrate so that the contact tips are not connected conductively.

Figure 9:
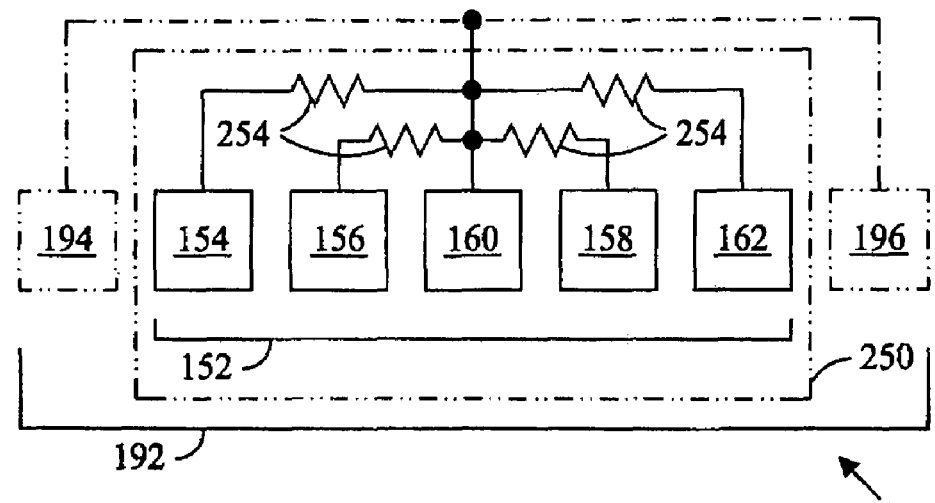
FIG. 9 is a schematic diagram of a grounded, "load" calibration structure.

Referring to FIG. 9, a grounded, "load" calibration structure 250 comprising a linear array 152 of five contact regions arranged to spatially co-locate with the contact tips of a five tip, differential signal probe includes resistors 254 that respectively connect the central contact region 160, arranged for engagement by the biasing contact tip of the probe, to the first 154, second 156, fourth 158 and fifth 162 contact regions which are arranged for engagement with the signal probe tips through which the differential signals are transmitting to and from the test structure. The resistance in the interconnections to the central contact region is greater than the resistance, typically less than one ohm (Ω), provided by the interconnections of a short calibration structure. Typically, the resistors 254 have a value approximating 50 Ω providing termination for the coaxial cables that typically connect the network analyzer and the probe. A grounded, load calibration structure 252 for a probe having a linear array 192 of seven contact tips includes the additional contact regions 194, 196 distal of the ends of the linear array 152 which are interconnected to the center contact region 160.

Figure 10:
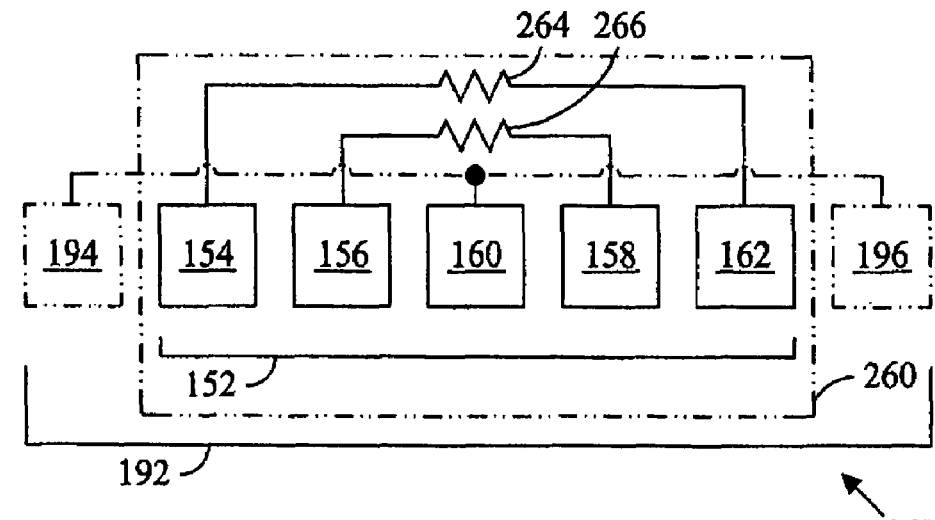
FIG. 10 is a schematic diagram of an ungrounded, "load" calibration structure.

Referring to FIG. 10, an ungrounded, "load" calibration structure 260 for a differential signal probe having a linear array of five contact tips comprises a linear array of contact regions 152 in which the first 154 and fifth 162 contact regions are interconnected by a resistor 264 and the second 156 and fourth 158 contact regions are interconnected by a resistor 266. Preferably, the each of the resistors 264 and 266 has a value of approximately 100Ω. An ungrounded, load calibration structure for a differential signal probe 262 having a linear array of seven contact tips includes the additional contact regions 194, 196 distal of the ends of the linear array 152 which are interconnected to the center contact region 160.

Figure 11:
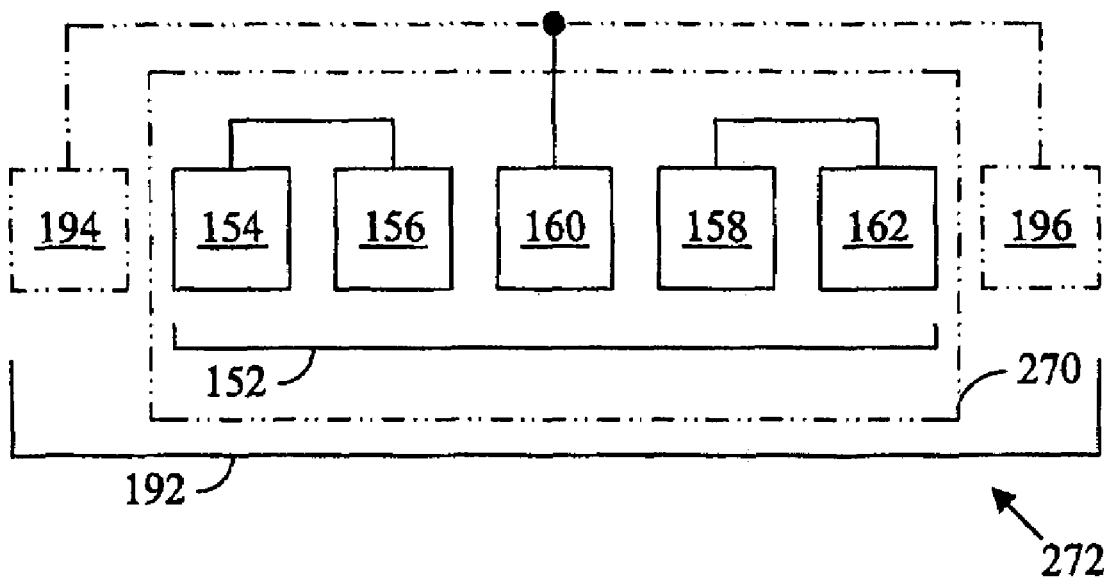
FIG. 11 is a schematic diagram of a "thru" calibration structure.

Referring to FIG. 11, in a "thru" calibration structure 270 each of the contact regions engageable by a probe tip transmitting one of the components of the digital signal to the calibration structure is interconnected by a short circuit to one of the contact regions arranged for engagement by one of the probe tips receiving a component of the output signal. For example, the first 154 contact region is short circuited to the second 156 contact region and the fourth 158 and fifth 162 contact regions are interconnected by a short circuit. Typically, one phase component of the differential signal, for example, $S_i^{+1}$, is transmitted to the test structure through one probe tip, for example probe tip 174 corresponding to contact region 154, and the output signal component of the same phase, for example, $S_o^{+1}$, is transmitted from the test structure to the network analyzer through the adjacent probe tip 176 corresponding to contact region 156. However, the probe tips communicating the input and output signals may be reversed. A thru calibration structure 272 for a probe having a linear array of seven probes tips includes the additional contact regions 194, 196 distal of the ends of the linear array 152 which are interconnected to the center contact region 160.

Figure 12:
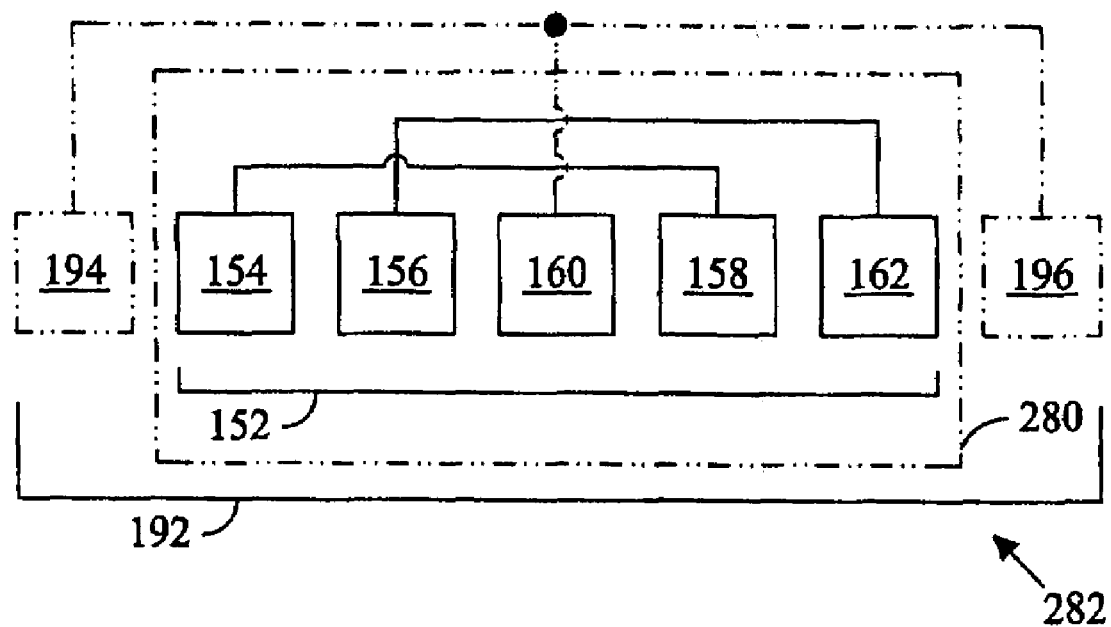
FIG. 12 is a schematic diagram of a "crossed thru" calibration structure.

Referring to FIG. 12, a "crossed thru" calibration structure 280 provides a short circuit interconnection between the first 154 contact region and the fourth 158 contact region and a short circuit interconnection between the second 156 contact region and the fifth 162 contact region of the linear array 152 of contact regions. The crossed thru calibration structure enables input signals of one phase component; for example, the even phase; to be communicated to the port for the output signal component of the opposite phase, for example, the odd phase. A crossed thru calibration structure 282 for a probe having a linear array of seven probes tips includes the additional contact regions 194,196 distal of the ends of the linear array 152 which are interconnected to the center contact region 160.

Additional calibration structures may be constructed with linear arrays of contact regions and a calibration element comprising, for examples, transmission lines; transmission lines with a twist; attenuator pads; inductors; capacitors; tunable elements; filters including low pass, high pass, all-pass, band-stop and band pass filters; interconnecting two or more contact regions.

A differential signal probe comprising a linear array of probe tips can be calibrated with a set of calibration standards appropriate for the particular calibration algorithm.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A probe calibration structure for calibrating a probe having five spaced apart probe tips, said five probe tips arranged in a linear array and operable to communicate a bias to a device under test from a centrally located probe tip and to communicate plural components of each of two radio frequency, differential signals with said device under test with pairs of probe tips disposed to either side of said centrally located probe tip, said probe calibration structure comprising:

(a) a substrate having a surface; and (b) a substantially linear array of five contact regions and no more than five contact regions on said surface of said substrate, said five contact regions arranged to spatially correspond to said probe tips of said linear array of five probe tips of a probe to be calibrated, each contact region spaced immediately apart from at least one other contact region, electrically isolated from each other contact region and engageable by a respective one of said five probe tips, a bias conducted by said centrally located probe tip to a centrally located contact region of said array of contract regions and one component of a pair of radio frequency, differential signals conducted to each contact region other than the centrally located contact region by respective contact tips.

2. A probe calibration structure for calibrating a probe having seven spaced apart probe tips, said seven probe tips arranged in a linear array and operable to communicate a bias to a device under test from a centrally located probe tip and from a probe tip at each extreme of said linear array and to communicate plural components of each of two radio frequency, differential signals with said device under test with pairs of probe tips disposed to either side of said centrally located probe tip, said probe calibration structure comprising:

(a) a substrate having a surface; and (b) a substantially linear array of seven contact regions and no more than seven contact regions on said surface of said substrate, said seven contact regions arranged to spatially correspond to said probe tips of said linear array of seven probe tips of a probe to be calibrated, each contact region spaced immediately apart from at least one other contact region, electrically isolated from each other contact region and engageable by a respective one of said seven probe tips, a bias conducted by said centrally located probe tip to a centrally located contact region of said array of contract regions and conducted by said probe tip at each end of said array of probe tips to a respective contact region at each end of said array of contact regions and one component of a pair of radio frequency, differential signals conducted to each contact region other than the centrally located contact region and the contact region at each end of said linear array by respective contact tips.

\* \* \* \* \*